US006327170B1

(12) United States Patent
Mueller et al.

(10) Patent No.: US 6,327,170 B1
(45) Date of Patent: Dec. 4, 2001

(54) REDUCING IMPACT OF COUPLING NOISE IN MULTI-LEVEL BITLINE ARCHITECTURE

(75) Inventors: Gerhard Mueller; Ulrike Gruening, both of Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/406,890

(22) Filed: Sep. 28, 1999

(51) Int. Cl.[7] .......... G11C 5/08

(52) U.S. Cl. .......... 365/69; 365/63

(58) Field of Search .......... 365/63, 230.06, 365/230.03, 69

(56) References Cited

U.S. PATENT DOCUMENTS 5,999,480 * 12/1999 Ong et al. .......... 365/230.06

* cited by examiner

*Primary Examiner*—David Nelms
*Assistant Examiner*—M. Tran
(74) *Attorney, Agent, or Firm*—Stanton C. Braden

(57) ABSTRACT

An integrated circuit comprising first and second bitline pairs 410 and 420 is described. The bitline paths of a bitline pair are on different bitline levels. The bitline paths of the first and second bitline pairs which are on different bitline levels are adjacent to each other. The first bitline pair comprises m vertical-horizontal twists 440, where m is a whole number≧1, and the second bitline pair comprises n vertical-horizontal twists 460 and 461, where n is a whole number≠m. The vertical-horizontal twists transform coupling noise into common mode noise.

23 Claims, 5 Drawing Sheets upper
lower
521a
522b
521c
522d
511a
512b
520
560
540
561
562
510
upper
512a
511b
lower
522a
521b
522c
521d

REDUCING IMPACT OF COUPLING NOISE IN MULTI-LEVEL BITLINE ARCHITECTURE

FIELD OF THE INVENTION

The present invention relates generally to reducing the adverse impact of noise coupling in signal lines of, for example, an integrated circuit (IC). In particular, the invention relates to bitline architectures which reduce the impact of noise to improve sensing of memory cells.

BACKGROUND OF THE INVENTION

Referring to FIG. 1, a conventional dynamic random access memory cell 101 is shown. As shown, the memory cell comprises a cell transistor 110 and a cell capacitor 150 for storing information. A first junction 111 of the transistor is coupled to a bitline 125, and a second junction 112 is coupled to the capacitor 150. A gate electrode 113 of the transistor is coupled to a wordline 126. A reference or constant voltage ($V_{pl}$) can be coupled to a plate of the capacitor. The plate which is coupled to the reference voltage can serve as a common plate in the memory array.

Cells are arranged in rows and columns to form an array, connected by wordlines in the row direction and bitlines in the column direction. The bitlines are coupled to sense amplifiers to facilitate memory accesses. Typically, a pair of bitlines is coupled to a sense amplifier. The bitline containing the selected memory cell is referred to as the bitline or bitline true and the other is referred to as the reference bitline or bitline complement.

The bitlines can be arranged in various types of bitline architectures, such as open, folded, open-folded, diagonal, multi-level, split-level, or split-level diagonal. Multi-level or split-level bitline architectures are described in, for example, Hamada et al., A Split Level Diagonal Bitline Stack Capacitor Cell for 256 Mb DRAMs, IEDM 92-7990, which is herein incorporated by reference for all purposes.

FIG. 2 shows a multi-level bitline architecture with vertical twists. As shown, a bitline pair 210 comprises bitlines 211 and 212 which occupy top and bottom bitline levels 230 and 220. The bitlines are vertically aligned with each other in the different bitline levels. Twists 280 are provided to switch the positions of the bitlines from the top to the bottom bitline level. The bitline segments occupying the bottom level comprise memory cells 250 coupled thereto. A memory access typically comprises precharging the bitlines to a predefined voltage level (e.g., equalization voltage or $V_{bleq}$).

A memory cell within a bitline pair is selected after the bitlines are precharged and floated. The memory cell is selected by rendering the transistor of the memory cell conductive, coupling the memory cell's capacitor to the bitline true. Depending on the value stored in the capacitor, the bitline true is pulled above or below $V_{bleq}$. The reference bitline, in the ideal case, remains at $V_{bleq}$. The voltage difference between the reference bitline and bitline true is the differential voltage. A sense amplifier coupled to the bitline pair senses and amplifies the differential voltage signal, which is indicative of the data stored in the selected memory cell.

An important issue to consider in designing memory ICs is to provide an adequate sensing signal (i.e., differential voltage) to the sense amplifier in order for the data to be read accurately from memory. The differential signal sensed by a sense amplifier, in an ideal situation, depends on the charge sharing between the bitline and the memory cell. The ratio of the bitline capacitance (and the capacitance of the sense amplifier) to the cell capacitance determines the magnitude of the differential signal.

However, the voltage of the reference bitline increases or decreases along with the voltage swing on the bitline true due to bitline coupling between the bitlines of the bitline pair (intra-bitline coupling), thereby decreasing the magnitude of the differential signal or signal margin. For example, substantial coupling noise between the reference bitline in the upper level and the bitline in the lower level in the vertical twisted multi-level bitline architecture causes a decrease in the signal margin of the differential signal. A reduction in the signal margin of the differential signal is undesirable as this may lead to incorrect evaluation of the data stored in the memory cell.

In addition, coupling noise from neighboring bitline pairs (inter-bitline coupling) can also reduce the signal margin. The sense amplifiers of the array may not be activated simultaneously. This occurs as a result of, for example, different amplification speeds for a "0" and a "1", difference in the threshold voltage of the various latch transistors, or a skew in the activation of the sense amplifiers in the top and bottom bank in an interleaved arrangement. Coupling noise from a bitline pair whose differential signal is amplified can reduce the differential signal of a neighboring bitline pair whose differential signal has yet to be amplified.

The problems associated with coupling noise become worse as technology migrates to smaller groundrules due to the fact that the fraction bitline-to-bitline capacitance contribution to the total bitline capacitance increases with smaller dimensions As evidenced from the foregoing discussion, it is desirable to reduce the impact of coupling noise.

SUMMARY OF THE INVENTION

The invention relates to reducing the adverse impacts of coupling noise from neighboring signal lines in integrated circuits with multiple signal line levels. In one embodiment, a memory IC comprises first and second bitline pairs in which the bitline paths of a bitline pair are on different bitline levels. The bitline paths of the different bitline pairs on different bitline levels are adjacent to each other. The first bitline pair comprises m vertical-horizontal twists, where m is a whole number$\geqq$1. The second bitline pair comprises n vertical-horizontal twists, where n is a whole number not equal to m. The vertical-horizontal twists switch the bitline paths of the bitlines within the bitline pair. The vertical-horizontal twists are provided along the bitline pairs to transform coupling noise between neighboring bitline pairs into common mode noise. Common mode noise is desirable since it does not reduce the signal margin of the differential signal.

DETAILED DESCRIPTION OF THE INVENTION

The invention relates generally to reducing the adverse impact of coupling noise in signal lines. In one embodiment, the invention reduces the impact of coupling noise in bitlines of ICs such as, for example, random access memories (RAMs) including dynamic RAMs (DRAMs), high speed DRAMs such as Rambus DRAMs and SLDRAMs, ferroelectric RAMs (FRAMs), synchronous DRAMs (SDRAMs), merged DRAM-logic chips (embedded DRAMs), or other types of memory ICs or logic ICs.

Figure 3:
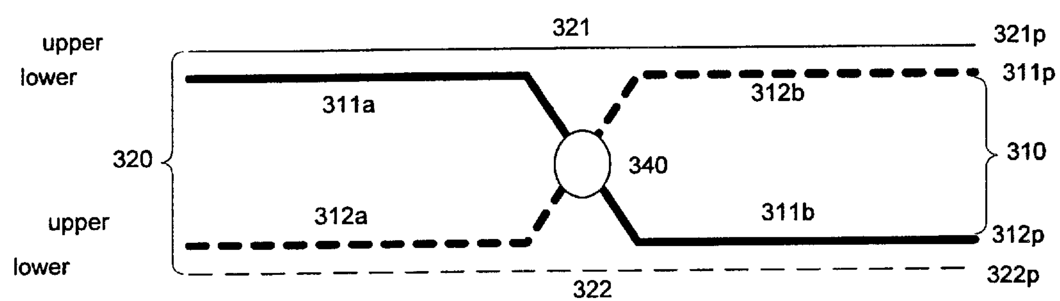
FIGS. 3–5 show embodiments of the invention for reducing the impact of coupling noise in signal lines.

FIG. 3 shows a plan view of one embodiment of the invention for reducing the adverse impact of coupling noise. First signal line pair 310 (bolded lines) and second signal line pair 320 (unbolded lines) are provided. The signal line pairs comprises signal lines, which, for example, can be differential signal lines, internal differential data lines, differential clock lines, or other types of differential signal lines in an IC.

In one embodiment, the signal line pairs comprise bitline pairs. Typically, one of the bitlines of the bitline pair is referred to as the bitline (solid line) and the other is referred to as the reference bitline (dotted line). The bitlines of a bitline pair occupy bitline paths that are on different horizontal and vertical planes. That is, the bitline paths of a bitline pair are on different bitline levels and are not vertically aligned on the different bitline levels. The different bitline levels can be realized in, for example, metal 0 (MO) and metal 1 (M1)of the IC.

In one embodiment, the first bitline pair comprises bitlines 311 and 312 occupying bitline paths 311*p* and 312*p*. Illustratively, bitline path 311*p* is located on a second bitline level while bitline path 312*p* is on a first bitline level. The first bitline level, for example, is the upper bitline level and the second bitline level is the lower bitline level. The bitline paths are not substantially aligned with each other on the different bitline levels. The second bitline pair comprises bitlines 321 and 322 that occupy bitline paths 321 p and 322*p*. Like the bitline paths of the first bitline pair, bitline paths 321*p* and 322*p* are on different bitline levels (first and second, respectively) and are not substantially vertically aligned with each other.

A bitline path of one bitline pair is adjacent to a bitline path of the other bitline pair on different bitline levels. In one embodiment, a bitline path of one bitline pair is substantially vertically aligned with a bitline path of the other bitline pair. Memory cells are, for example, coupled to bitline segments in the lower bitline level. Providing bitline paths of one bitline pair which are offset with respect to bitline paths of another bitline pair can also be useful, for example, to facilitate coupling of memory cells to the bitlines on different bitline levels.

As shown, a bitline path of the first bitline pair is adjacent to a bitline path of the second bitline pair on the same bitline level. Interleaving one or more bitline paths from other bitline pairs between the bitline paths of the first and second bitline pairs is also useful.

To reduce the impact of coupling noise between the bitline pairs, m twists are provided in one of the bitline pairs, where m is a whole number$\geqq$1. A twist switches the bitline paths of the bitlines within the bitline pair. Since the bitline paths of the bitline pair are not on the same bitline level and are not vertically aligned with each other, the twist changes the vertical and horizontal positions of the bitlines within the bitline pair. As such, the twist is referred to as a vertical-horizontal (v-h) twist. The other bitline pair can be provided with n v-h twists, where n is a whole number not equal to m.

The twists separate the bitlines into a plurality of bitline segments (m+1 or n+1 if n>0). The first and second bitline pairs comprise a different number of segments since each contains a different number of twists. The total lengths of the first and second bitline segments in a bitline path are about equal. The twist or twists are placed such that the bitlines from one bitline pair and the bitlines from the other bitline pair impact each other in the same manner. Thus, coupling noise between the bitline pairs is transformed into common mode noise, which does not adversely impact the signal margin of the differential signal between the bitlines of a bitline pair.

In one embodiment, one v-h twist 340 is provided in the first bitline pair 310 and bitline pair 320 does not comprise any v-h twists (i.e., m=1 and n=0). The v-h twist is located at about the middle of the bitline pair, separating the bitlines 311 and 322 into bitline segments 311*a–b* and reference bitline segments 312*a–b* of about ½ the length of a bitline. The v-h twist switches the vertical and horizontal positions of the bitlines within the bitline pair (i.e., changes the bitline paths of the bitlines). To the left of the v-h twist 340, bitline 311 (segment 311*a*) occupies bitline path 311*p* which is located on the lower level and reference bitline 312 (segment 312*a*) occupies bitline path 312*p* on the upper bitline level. However, the bitline (segment 311*b*) and reference bitline (segment 312*b*) to the right of twist 340 now occupy bitline paths 312*p* and 311*p*, respectively, switching the paths of the bitlines within the bitline pair. As a result of the v-h twists, most of the various coupling noise components are transferred into common mode noise which is advantageous since common mode noise does not decrease the magnitude of the differential signal.

Figure 4:
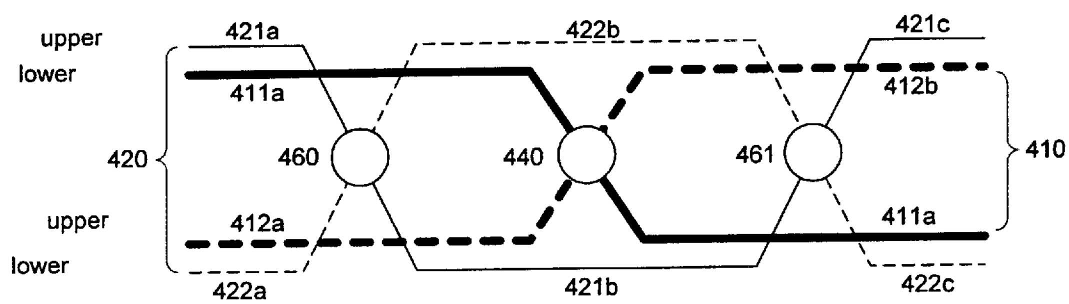

FIG. 4 shows another embodiment of the invention for reducing the impact of coupling noise. As shown, v-h twists are provided in first and second bitline pairs 410 and 420. In one embodiment, bitline pair 420 comprises v-h twists 460 and 461, and bitline pair 410 comprises v-h twist 440. Twists 460 and 461 separate bitlines of the bitline pair 420 into segments 421*a–c* and segments 422*a–c*. Bitline segments 421*a*, 421*c*, 422*a*, and 422*c* are each about ¼ the length of a bitline and segments 421*b* and 422*b* are each about ½ the length of a bitline. Twist 440 separates bitlines of the bitline pair 410 into segments 411*a–b* and 412*a–b*, each being about ½ the length of a bitline. The twists alter the vertical and horizontal positions of the bitlines within the bitline pairs. The twists of a bitline pair separates the bitlines into segments of a predefined length such that the total lengths of the first and second bitline segments along a bitline path are about equal. The twists are located along the bitline pairs to transform coupling noise between the bitline pairs into common mode noise.

Figure 5:
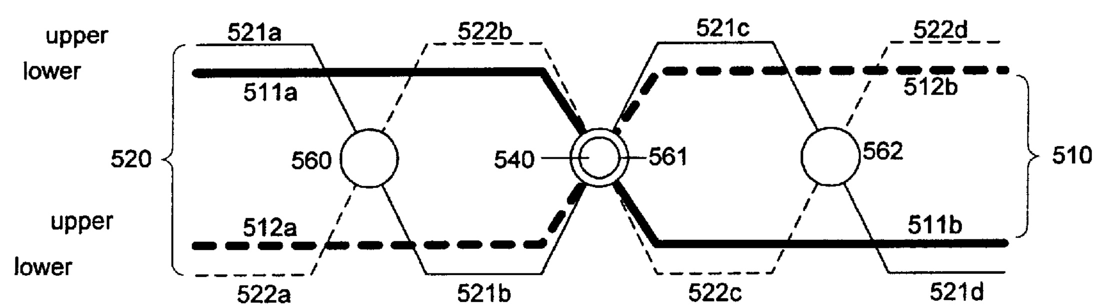

FIG. 5 shows yet another embodiment of the invention for reducing the impact of coupling noise. As shown, v-h twists are provided in first and second bitline pairs 510 and 520. Bitline pair 520 is provided with v-h twists 560–562 and bitline pair 510 is provided with a v-h twist 540. The twists 560–562 divide the bitlines into segments 521*a–d* and 522*a–d*, each about ¼ the length of a bitline. The twist 540 divides the bitlines of the bitline pair 510 into segments 511*a–b* and 512*a–b*, each being about ½ the length of a bitline. The twists alter the vertical and horizontal positions of the bitlines within the bitline pairs in order to cause coupling noise between the bitline pairs to be common mode noise.

FIG. 6 shows a plan view of an array 600 in accordance with one embodiment of the inventions. The array includes a plurality of building blocks 601 which comprise first and second bitline pairs 410 and 420. The first bitline pair is provided with a v-h twist 440 (m=1) and the second bitline pair is provided with twists 460 and 461 (n=2). The building blocks are repeatedly placed adjacent to other building blocks to form the array. By using building blocks with v-h twists to form the array, coupling noise within the building block and from adjacent building blocks is transformed into common mode noise, which does not degrade signal margin.

Figure 1:
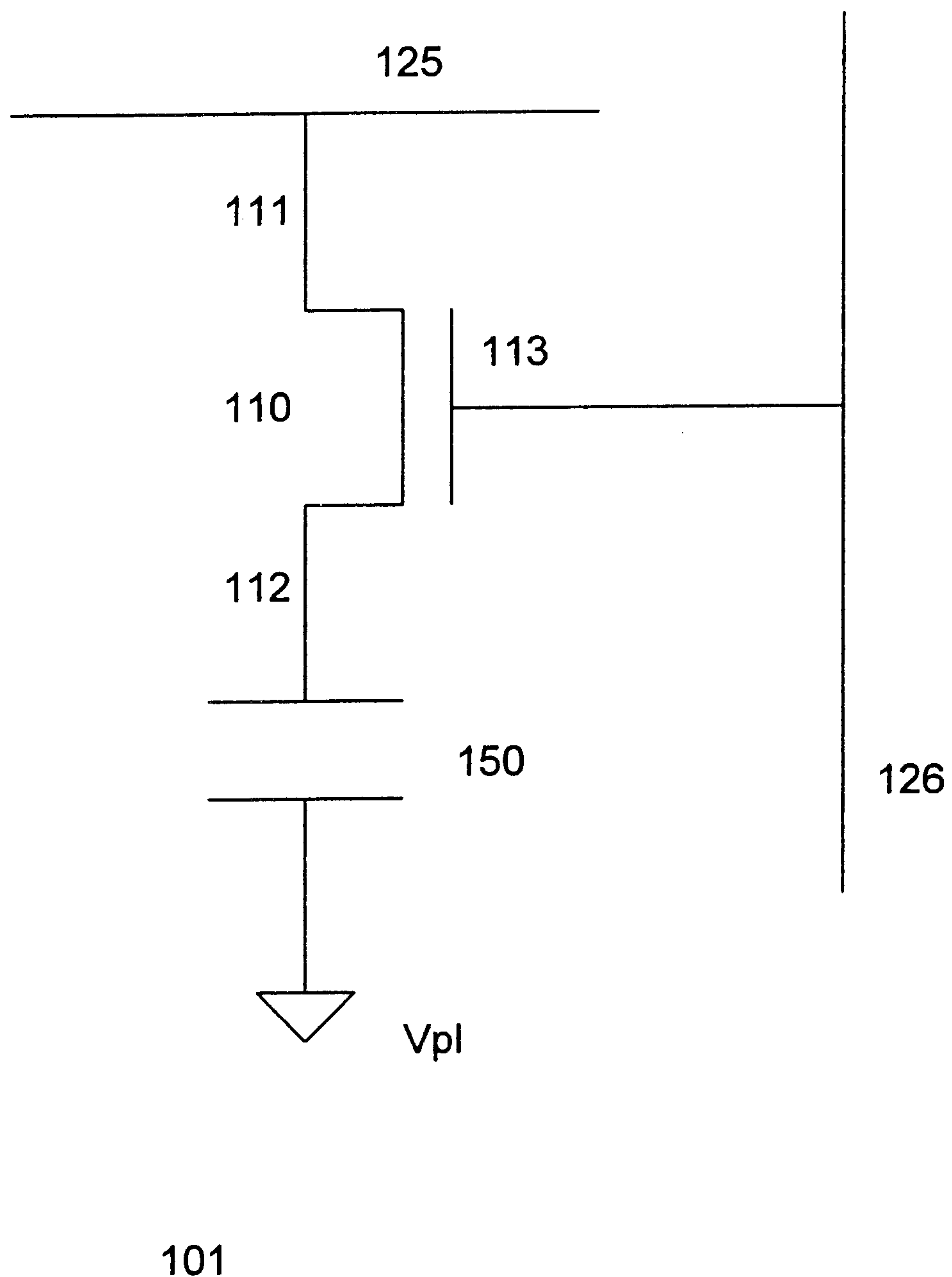
FIG. 1 shows a memory cell.
Figure 2:
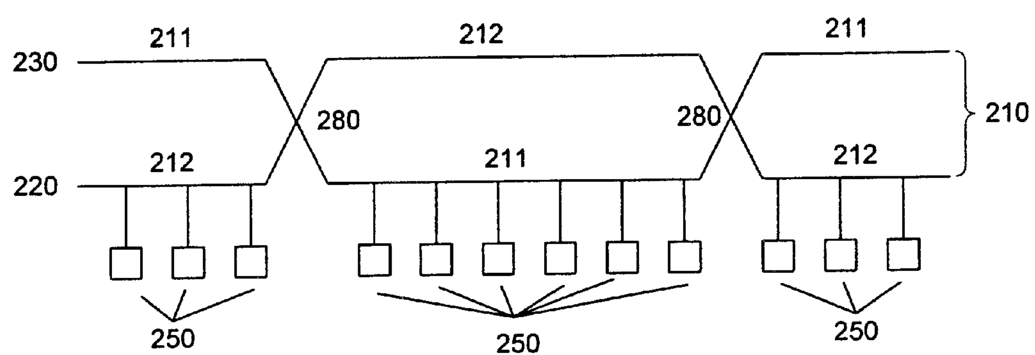
FIG. 2 shows a multi-level bitline architecture with vertical twists.

Illustratively, the building blocks used are similar to the first and second bitline pairs described in FIG. 4. The use of building blocks such as those described in FIG. 3, FIG. 5, or other configurations are also useful to reduce the impact of coupling noise. It is not necessary to configure all building blocks in the array with the same m and n values. Also, interleaving building blocks together can be useful. Interleaving building blocks results in bitline paths of a building block being adjacent to bitline paths from another building block. In one embodiment, the building blocks are interleaved together such that the bitline paths of a building block are not adjacent to each other. Providing an array with a variety of different types of building blocks, such as building blocks with vertical twists as described in FIG. 2 and/or building blocks with twists such as those described in concurrently filed U.S. patent application (U.S. Ser. No. 09/406891), titled REDUCING IMPACT OF COUPLING NOISE, which is herein incorporated by reference for all purposes, along with building blocks comprising v-h twists is also useful.

While the invention has been particularly shown and described with reference to various embodiments, it will be recognized by those skilled in the art that modifications and changes may be made to the present invention without departing from the spirit and scope thereof. Merely by way of example, the invention can be useful for reducing the adverse impact of coupling noise in any type of differential signal lines. The scope of the invention should therefore be determined not with reference to the above description but with reference to the appended claims along with their full scope of equivalents.

What is claimed is:

1. An integrated circuit comprising:

first and second signal line paths, the first signal line path being located on a first metal level and the second signal line path being located on a second metal level, wherein the first and second signal line paths are not substantially aligned;

a first signal line pair having first and second signal lines, the first and second signal lines occupy the first and second signal paths;

third and fourth signal line paths, the third signal line path being located on the first metal level and the fourth signal line path being located on the second metal level, wherein the third and fourth signal line paths are not substantially aligned;

a second signal line pair having third and fourth signal lines occupying the third and fourth signal paths; and m vertical-horizontal (v-h) twists in the first signal line pair, where m is a whole number$\geqq$1, the v-h twists switch signal paths of the first and second signal lines of the first signal line pair, wherein the m v-h twists separate the first and second signal lines of the first signal line pair into m+1 segments.

2. The integrated circuit of claim 1 wherein a total length of the first signal line segments and a total length of the second signal line segments along a signal line path are about equal.

3. The integrated circuit of claim 1 wherein m=1.

4. The integrated circuit of claim 1, 2, or 4 wherein the second signal line pair comprises n v-h twists, where n is a whole number$\neq$m.

5. The integrated circuit of claim 4 wherein the n twists, if n>0, separate the first and second signal lines of the second signal line pair into n+1 segments.

6. The integrated circuit of claim 5 wherein a total length of the first signal line segments and a total length of the second signal line segments along a signal line path of the second signal line pair are about equal.

7. The integrated circuit of claim 6 wherein the m twists and n twists are located along the first and second signal line pairs to transform coupling noise between the signal line pairs into common mode noise.

8. The integrated circuit of claim 4 wherein n equals 2 or 3.

9. The integrated circuit of claim 8 wherein the n twists separate the first and second signal lines of the second signal line pair into n+1 segments.

10. The integrated circuit of claim 9 wherein a total length of the first signal line segments and a total length of the second signal line segments along a signal line path of the second signal line pair are about equal.

11. The integrated circuit of claim 10 wherein the m twists and n twists are located along the first and second signal line pairs to transform coupling noise between the signal line pairs into common mode noise.

12. The integrated circuit of claim 4 wherein the m twists and n twists are located along the first and second signal line pairs to transform coupling noise between the signal line pairs into common mode noise.

13. The integrated circuit of claim 1 wherein the signal pairs comprises bitline pairs with first and second bitlines occupying first and second bitline paths on first and second bitline levels.

14. The integrated circuit of claim 13 wherein the m twists separates the first and second bitlines of the first bitline pair into m+1 segments.

15. The integrated circuit of claim 14 wherein a total length of the first bitline segments and a total length of the second bitline segments along a signal line path are about equal.

16. The integrated circuit of claim 13 wherein m=1.

17. The integrated circuit of claim 13, 14, 15, or 16 wherein the second bitline pair comprises n v-h twists, where n is a whole number$\neq$m.

18. The integrated circuit of claim 17 wherein the n twists, if n>0, separate the first and second bitlines of the second bitline pair into n+1 segments.

19. The integrated circuit of claim 18 wherein a total length of the first bitline segments and a total length of the second bitline segments along a bitline path of the second bitline pair are about equal.

20. The integrated circuit of claim 19 wherein the m twists and n twists are located along the first and second bitline pairs to transform coupling noise between the signal line pairs into common mode noise.

21. The integrated circuit of claim 20 further comprises memory cells coupled to the bitlines.

22. The integrated circuit of claim 21 further comprises memory cells coupled to the bitlines segments which are located in lower bitline level.

23. The integrated circuit of claim 17 wherein the m twists and n twists are located along the first and second bitline pairs to transform coupling noise between the signal line pairs into common mode noise.

* * * * *